(12) United States Patent
Franz et al.

(10) Patent No.: US 7,474,229 B2
(45) Date of Patent: Jan. 6, 2009

(54) COMPUTER SYSTEM INDICATOR PANEL WITH EXPOSED INDICATOR EDGE

(75) Inventors: John P Franz, Houston, TX (US); Jim B Duke, Houston, TX (US); David M Paquin, Houston, TX (US); Kelly K Smith, Houston, TX (US); Erik R Nielsen, Houston, TX (US); David A Selvidge, Houston, TX (US); David W. Deis, Houston, TX (US); Jeoff M Krontz, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 371 days.

(21) Appl. No.: 11/531,433

(22) Filed: Sep. 13, 2006

(65) Prior Publication Data

US 2008/0068199 A1    Mar. 20, 2008

(51) Int. Cl.
*G08B 5/00*    (2006.01)
(52) U.S. Cl. ............... 340/815.4; 340/679; 340/691.6; 361/686; 361/724; 361/683
(58) Field of Classification Search ............. 340/815.4, 340/679, 691.6, 815.45, 815.47, 815.73, 340/525; 361/683, 679, 685, 686, 724, 727
See application file for complete search history.

(56) References Cited

U.S. PATENT DOCUMENTS

| | | | |
|---|---|---|---|
| 5,216,411 A | 6/1993 | Ashitomi | |
| 6,018,456 A * | 1/2000 | Young et al. | 361/684 |
| 6,462,670 B1 | 10/2002 | Bolognia et al. | |
| 6,597,566 B1 * | 7/2003 | Phan | 361/683 |
| 6,636,426 B2 * | 10/2003 | Inman | 361/724 |
| 6,654,239 B2 | 11/2003 | Smith | |
| 6,702,412 B2 | 3/2004 | Dobler et al. | |
| 6,717,802 B2 * | 4/2004 | Sa et al. | 361/683 |
| 6,754,084 B1 | 6/2004 | Bolognia et al. | |
| 6,778,381 B1 | 8/2004 | Bolognia et al. | |
| 6,919,816 B2 * | 7/2005 | Dearborn et al. | 340/815.45 |
| 6,962,397 B2 | 11/2005 | Dobler et al. | |
| 6,976,745 B2 | 12/2005 | Dobler et al. | |
| 7,436,674 B2 * | 10/2008 | Barsun et al. | 361/727 |
| 2001/0023141 A1 | 9/2001 | Chang | |

FOREIGN PATENT DOCUMENTS

DE    100 34 640    4/2001
DE    101 19 476    10/2002

* cited by examiner

*Primary Examiner*—Toan N Pham

(57) ABSTRACT

A computer system comprising a computer chassis supporting at least one electronic component, the computer chassis having a volume and at least one interactive surface; an indicator panel supported by the computer chassis and coupled to the electronic component, the indicator panel having a display and an outer edge; wherein the indicator panel comprises a first position wherein the indicator panel is received within an aperture in the interactive surface, the indicator panel and the display are disposed within the chassis volume, and the outer edge is exposed and indicates a condition of the electronic component.

20 Claims, 10 Drawing Sheets

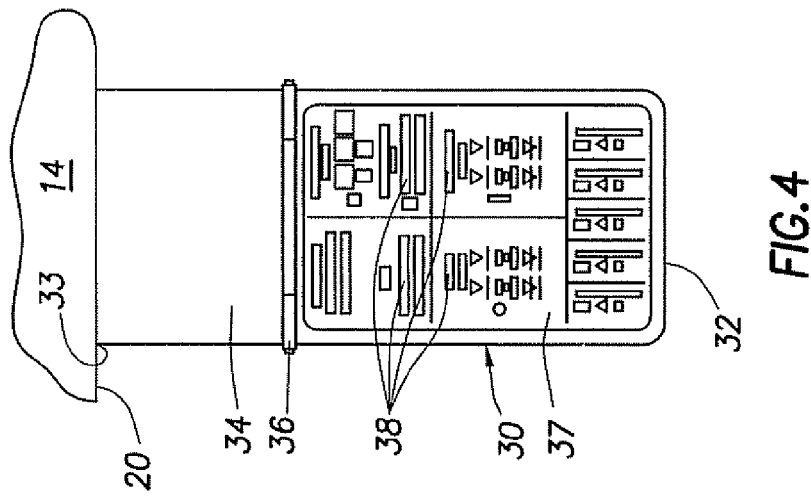
FIG. 4
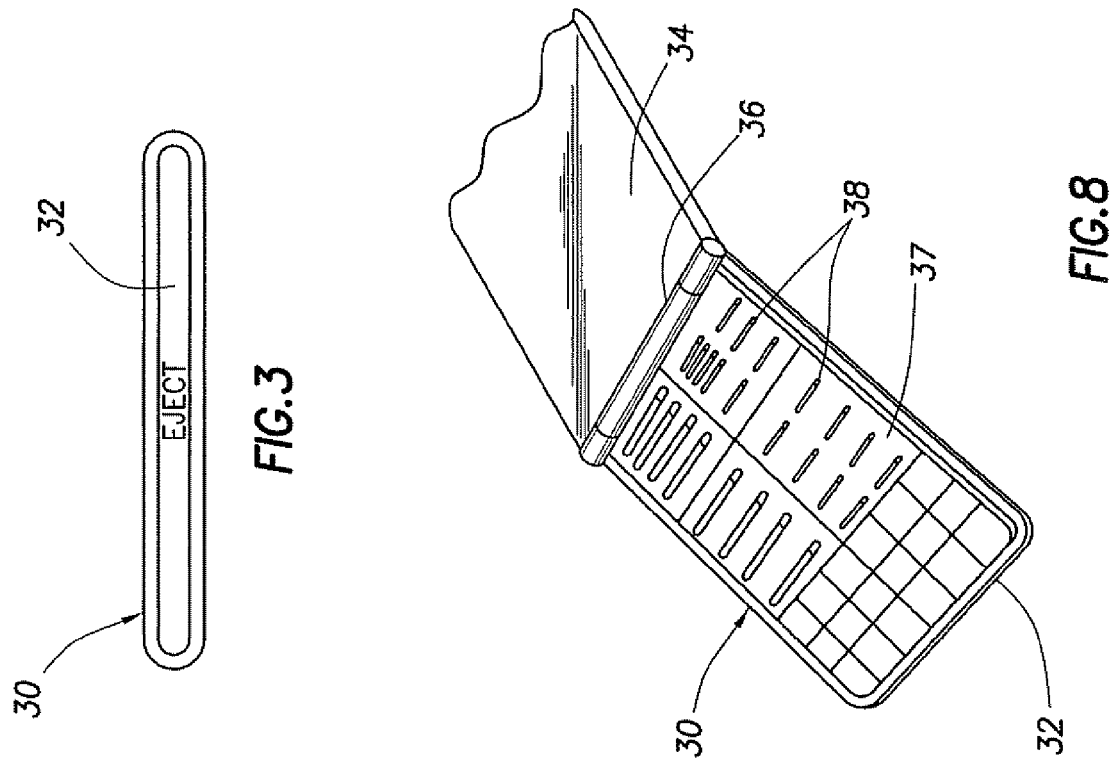
FIG. 3
FIG. 8

US 7,474,229 B2

COMPUTER SYSTEM INDICATOR PANEL WITH EXPOSED INDICATOR EDGE

BACKGROUND

Computer systems include numerous electronic components that require monitoring such that the health of the components are known during operation of the computer system. Light emitting diodes (LED), for example, are coupled to the electronic components and indicate information about the health of the electronic components such that a viewer is able to diagnose the system. The LEDs are mounted throughout the inside of a computer chassis, and accessible by opening a cover of the chassis. In some cases, the LEDs are mounted in various locations on the surface of the chassis, where space is available.

Many computer systems and components, such as servers, routers, and storage arrays, are configured for mounting in rack enclosures that allow for efficient storage of multiple components Many rack enclosures are essentially large cabinets into which a plurality of components are mounted. These racks are often designed for densely storing a multitude of components while allowing for easy access to the components for upgrading and maintenance. Reducing the size of the computer system often involves packaging components in close proximity to each other, as well as reducing the externally viewable surface area of the computer chassis while it is installed in a rack. This "densification" of computer systems is, therefore, restricting access to the internal electronic components of the system and limiting the external display capabilities of the system.

SUMMARY

A computer system comprising a computer chassis supporting at least one electronic component, the computer chassis having a volume and at least one interactive surface; an indicator panel supported by the computer chassis and coupled to the electronic component, the indicator panel having a display and an outer edge; wherein the indicator panel comprises a first position wherein the indicator panel is received within an aperture in the interactive surface, the indicator panel and the display are disposed within the chassis volume, and the outer edge is exposed and indicates a condition of the electronic component.

BRIEF DESCRIPTION OF THE DRAWINGS

For a detailed description of exemplary embodiments of the invention, reference will now be made to the accompanying drawings in which:

FIG. 3 shows a portion of the indicator panel of FIG. 2;

FIG. 4 shows a top view of the indicator panel of FIG. 3;

FIG. 8 shows the indicator panel of FIG. 4;

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1:
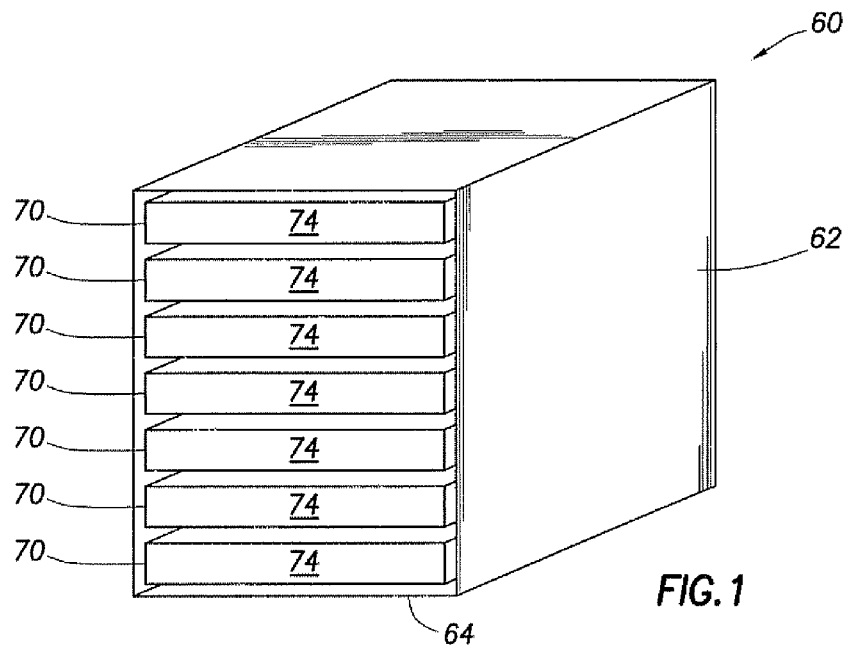
FIG. 1 shows an exemplary array of computer systems supported by a rack.

Referring to FIG. 1, a rack enclosure 60 comprises a rack frame 62 having an open front end 64. Front end 64 is adapted to receive and frame 62 is adapted to support computer systems 70, stacked one upon another in close proximity to each other as shown. Computer systems, or servers, 70 comprise front faces 74, which may comprise indicators, removable devices, and other interactive components necessary for operation of system 70.

Figure 2:
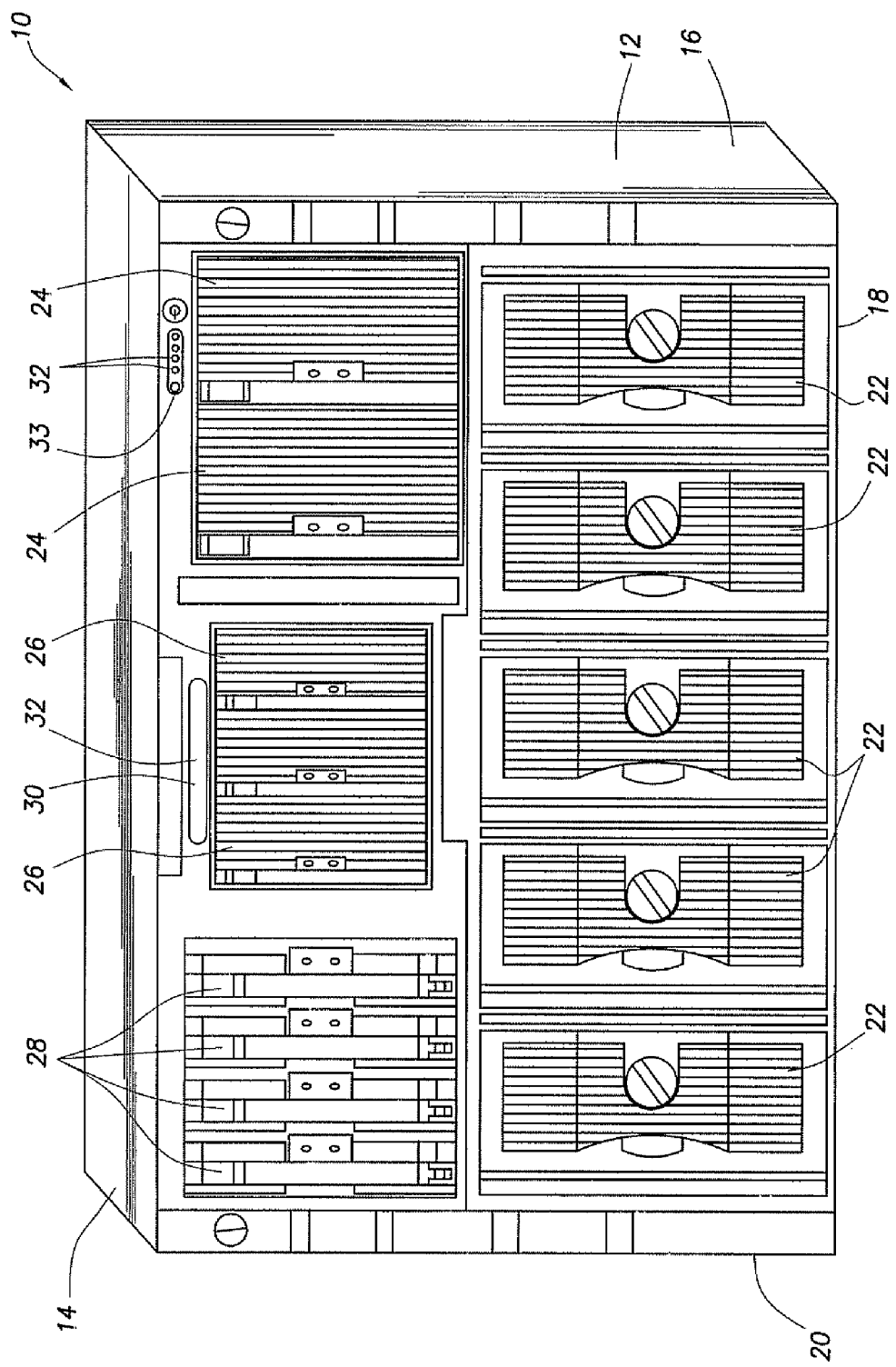
FIG. 2 shows a computer system and indicator panel constructed in accordance with embodiments of the invention.

Referring now to FIG. 2, a computer system or server 10 comprises a chassis 12 having a top surface 14, a side surface 16, a bottom surface 18, and a front-facing interactive surface 20 similar to front faces 74 of FIG. 1. Surface 20 is the most visible and accessible surface of chassis 12. Interactive surface 20 further comprises a plurality of removable, hot-plug devices and indicators. Removable, hot-plug devices 22, 24, 26, 28 include such removable components as memory, hard drives, power supplies, power converters, and others known to persons having ordinary skill in the art Surface 20 is interactive because it provides a user interface for the aforementioned hot-plug devices or other devices that communicate with internal components of system 10.

Interactive surface 20 also includes indicator panel 30, shown in FIG. 2 in the inserted, stored, or retracted position with an outer edge 32 being exposed and visible. Outer edge 32 is shown enlarged in FIG. 3. In the retracted position, panel 30 is received within an aperture 33 of surface 20. In this position, panel 30 and a display 37 (shown, for example, in FIGS. 3 and 4) are disposed within the volume of chassis 12 while outer edge, being set apart from display 37, is exposed to interactive surface 20.

Panel 30 is coupled to at least one of the electronic components of system 10, such as components 22, 24, 26, 28. Outer edge 32 is adapted to relay information about system 10 from within chassis 12 by visible indication. For example, outer edge 32 may provide a warning signal by becoming lighted. Outer edge 32 indicates a fault in a component of system 10 by being lit via an LED (not shown), A strip in edge 32 is back lit by an LED disposed beneath a transparent or translucent surface. Alternatively, a strip in edge 32 is back lit by an LED coupled to the strip via numerous fiber optic strands. Other lighted strips and additional indicating devices are suitable for providing a signal at edge 32.

Referring now to FIG. 4, indicator panel 30 is shown in an extended or ejected position relative to interactive surface 20 and chassis 12, from a top view. In this position, panel 30 and display 37 are external of the volume of chassis 12 via aperture 33. Support member or tongue 34 supports indicator panel 30, and is coupled to panel 30 via hinge 36. Hinge 36 is a friction hinge, for example, or other hinges suitable for allowing movement of the indicator panel. Indicator panel 30 comprises a display 37 including indicators 38, Indicators 38 comprise LEDs and other suitable light emitting devices. The various indicators 38 are coupled to and correspond with the electronic components or functions of system 10, including, for example, a power supply, a memory, a processor, a fan, a power regulator, a temperature sensor, a connector interconnect within system 10, network activity, user identification, and other components and functions of computer systems or servers known to persons having ordinary skill in the art. The LED indicators 38 are arranged on display 37 such that their layout coincides with the physical placement or layout of the electronic components of system 10 within chassis 12; such a coordinated representation of the electronic components on the display assists the user in relating indicator signals to specific components.

Figure 5:
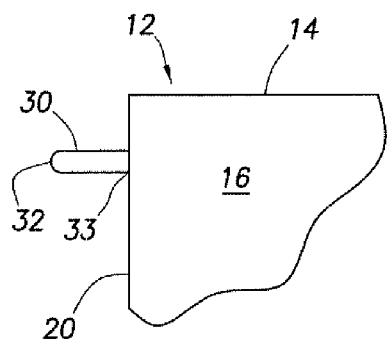
FIG. 5 shows a side view of portions of the indicator panel and computer system of FIGS. 2-4.

In operation, and referring to the side view of an upper portion of chassis 12 of FIG. 5, indicator panel 30 is partially ejected by manually pulling on panel 30 through aperture 33 in response to a general fault signal indicated by LED-lit edge 32. Alternatively, panel 30 is ejected by pushing on edge 32, with an automatic ejection response. Such an automatic response is achieved by a "push-push" mechanism or a snap lock mechanism, or other retention and ejection mechanisms suitable for retaining and ejecting the indicator panel. Movement of panel 30 is supported by a guide rail system, a rail and screw track system, or other support systems suitable for supporting the indicator panel.

Figure 6:
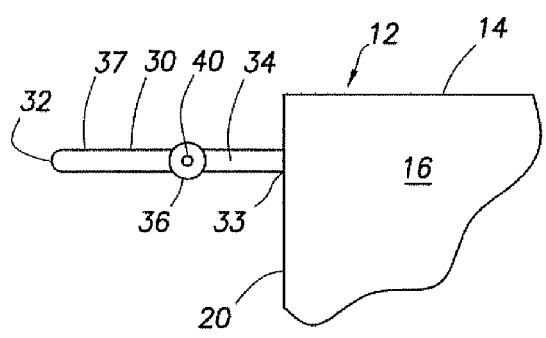
FIG. 6 shows a side view of the indicator panel and computer system of FIG. 5.

Referring now to FIG. 6, panel 30 is shown fully ejected and a plane defined by panel 30 is substantially perpendicular to the plane defined by interactive surface 20. As well as being substantially perpendicular to the plane of interactive surface 20, the plane of panel 30 is generally parallel to a plane defined by top surface 14 (see also FIG. 4). At this stage of ejection, tongue 34 is generally coplanar with panel 30, as hinge 36 constrains movement of panel 30 at the pivot point about axis 40.

Figure 7:
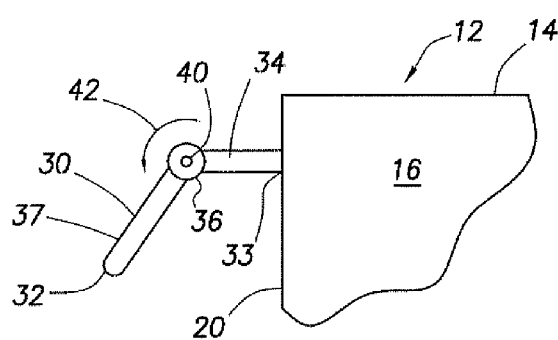
FIG. 7 shows a side view of the indicator panel and computer system of FIG. 5.

Diagnostic display 37 lies in the same plane defined by panel 30 such that it may be viewed in the fully ejected position to determine the exact fault indicated generally by back lit edge 32. Additionally, for ease of viewing, panel 30 may be angled downwardly as shown in FIG. 7, by pressing down on the top of panel 30. Friction hinge 36 will respond by allowing pivotal movement of panel 30 about axis 36. Panel 30 is also adapted to rotate upwardly. Generally, panel 30 is adapted to rotate about axis 36 as needed for a viewer to properly see display 37, whether the viewer is above, eye level with, or below a server 10 disposed in the various levels of a rack 60. Upon rotation of panel 30 about axis 40, as shown by arrow 42 in FIG. 7, the plane of panel 30 becomes transverse relative to the planes of surface 14 and tongue 34. Tongue 34 maintains a plane generally parallel with the plane of surface 14 as panel 30 is rotated. Tongue 34 also supports the wiring, cabling, and other transmission media for carrying data and power to panel 30. FIG. 8 shows a perspective view of panel 30 in an extended and angled position, supported by tongue 34 and angled via hinge 36.

Figure 9:
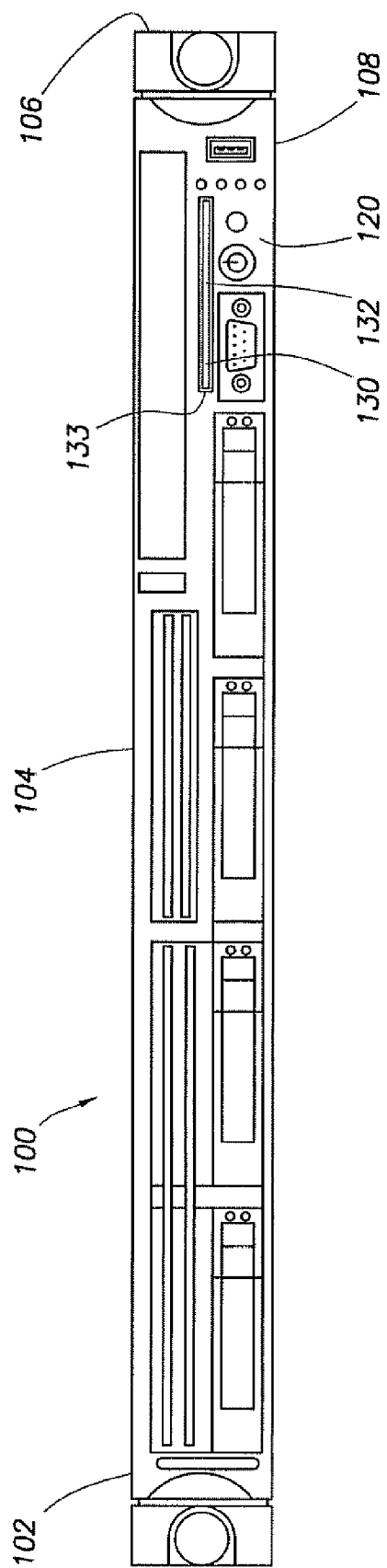
FIG. 9 shows a computer system and indicator panel constructed in accordance with embodiments of the invention.

In another embodiment of the invention, FIG. 9 shows a server 100 comprising a chassis 102, a top surface 104, a side surface 106, a bottom surface 108, and a front viewable interactive surface 120. An indicator panel 130 is shown received within an aperture 133 and having a front viewable edge 132. Panel 130 is coupled to the electronic components of server 100, similar to panel 30, and indicates a fault, status, or other condition of at least one of these components by lighting edge 132, or a portion thereof, as previously described.

Figure 10:
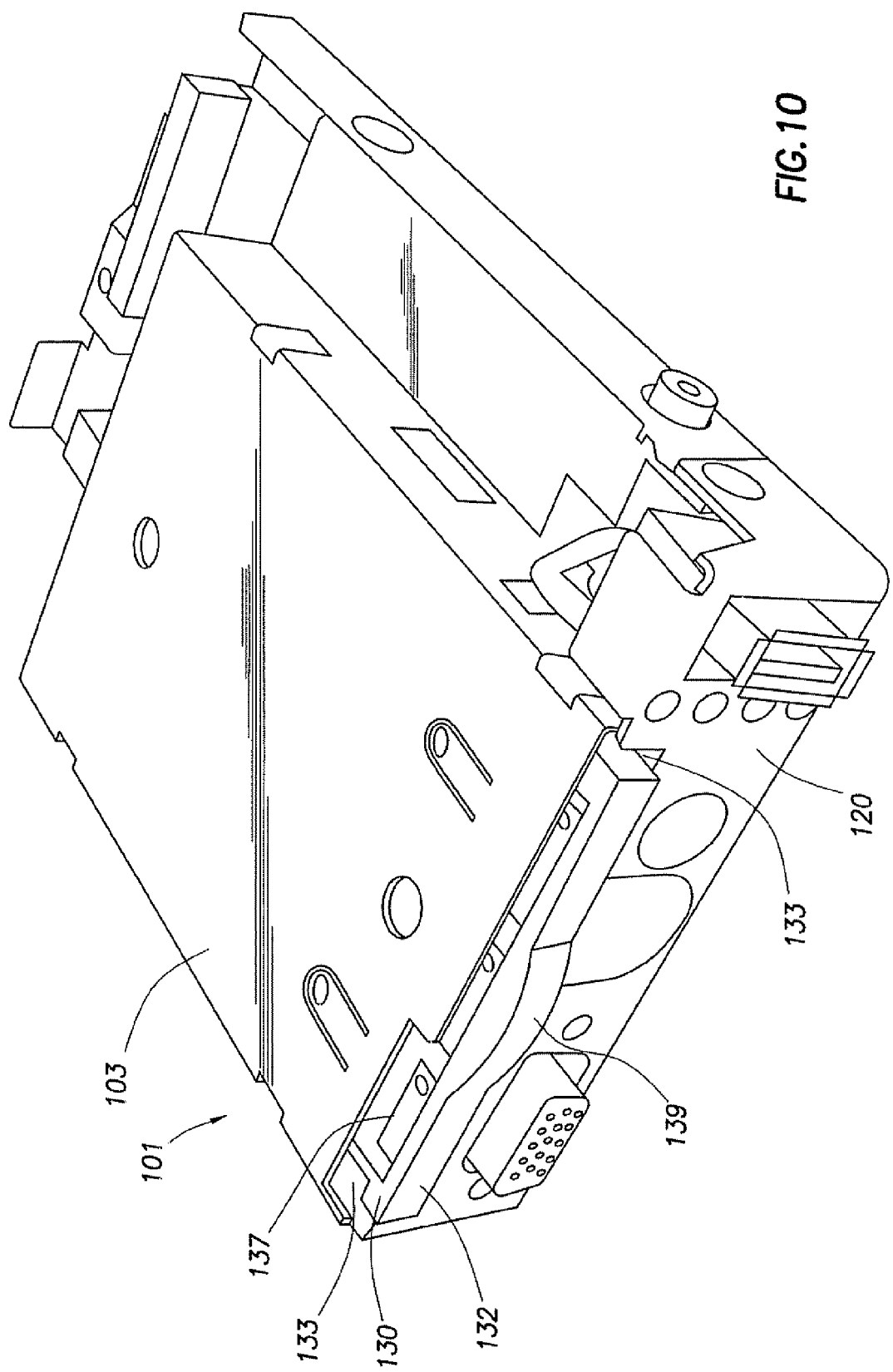
FIG. 10 shows the indicator panel of FIG. 9.

Referring now to FIG. 10, panel 130 is disposed within a housing 103 of a portion 101 of chassis 102. As shown, housing 103 retains panel 130 within a volume of chassis 102, and edge 132 is adjacent an opening or aperture 133 of housing 103 and interactive surface 120, Panel 130 is shown in a retracted or stored position, wherein display 137 is hidden within the chassis volume. When desired, such as upon back lighting edge 132 or otherwise illuminating a portion of edge 132, projection 139 may be pulled or pushed as previously described. Illuminating edge 132 represents a fault in an electronic component of server 100, including, for example, a power supply, a memory, a processor, a fan, a power regulator, or temperature sensor. Pushing or pulling on projection 139 begins the ejection process whereby more information about the fault is gained by viewing the ejected panel.

Figure 11:
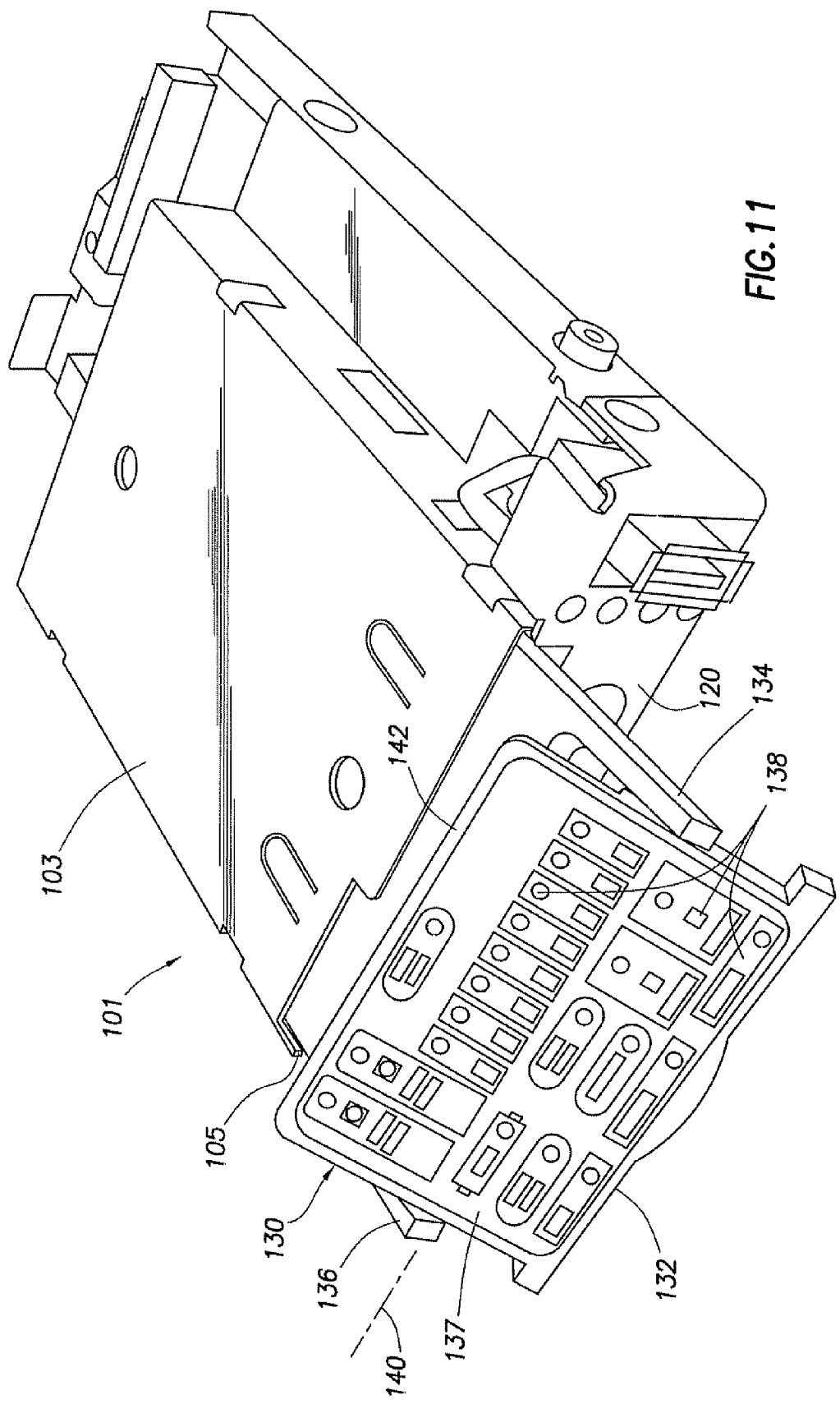
FIG. 11 shows the indicator panel of FIG. 10.

The ejection of panel 130 occurs similarly to panel 30 with reference to FIGS. 5 and 6, Panel 130 moves in a plane perpendicular to surface 120 and parallel to surface 104 of chassis 102 until fully ejected. In the ejected position, a display 137 is viewed best from various angles of a top down position, as when a viewer is standing above a server 100 that is located toward the bottom of a rack. If a viewer is positioned at eye level with, or below server 100, panel 130 is rotated to provide a better viewing angle. With reference to FIG. 11, panel 130 has been rotated about a hinge 136 having axis 140 such that edge 132 is moved downward, a top edge 142 is moved upward, and display 137 faces generally outward from surface 120. Panel 130 is adjustable to be placed in additional rotational positions about hinge axis 140. Display 137 includes LED indicators 138 arranged to represent the positional arrangement of their corresponding components of system 100 within chassis 102. One or more of indicators 138 will be lit to provide additional detail concerning the fault indicated by illuminated edge 132.

Figure 12:
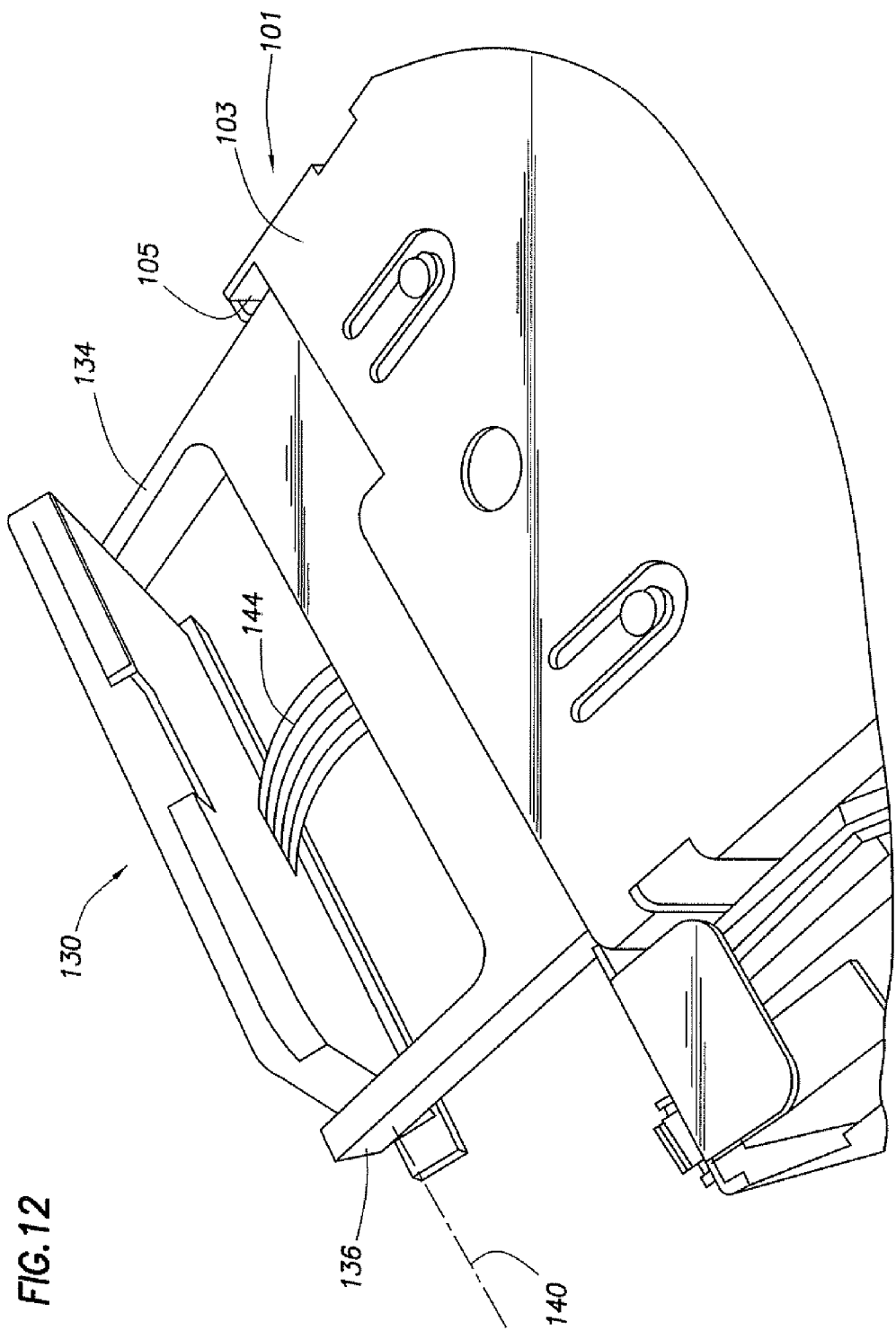
FIG. 12 shows the indicator panel of FIG. 10.

FIG. 12 is a generally rear view of the positioned panel 130 shown in FIG. 11. Shown in further detail is a support extension 134 coupled to panel 130 via hinge 136. Also shown is wiring 144 for communicating power and data to panel 130. As previously described, housing 103 supports extension 134 and panel 130, and housing 103 is a part of portion 101 of chassis 102. Housing 103 also comprises an internal guide system (not shown) for relative sliding movement of panel 130 and extension 134 assembly, such an internal guide system being in accordance with those previously described or otherwise suitable for guiding the indicator panel.

Figure 13:
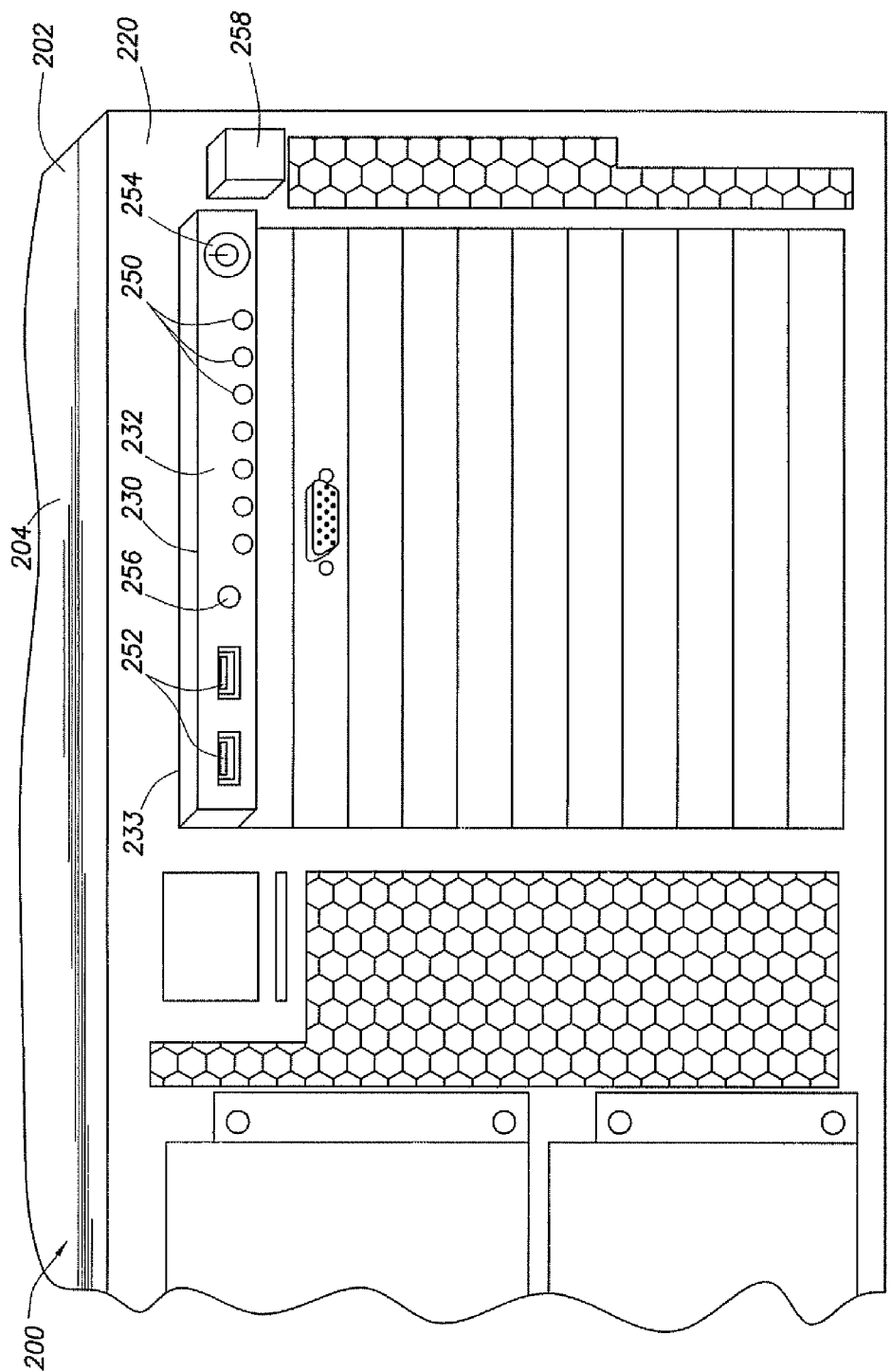
FIG. 13 shows a computer system and indicator panel constructed in accordance with embodiments of the invention.

Referring now to FIG. 13, another embodiment of the invention is shown. A system 200 is shown that comprises similar components as systems 10, 100 described herein, such as a chassis 202 and internal electronic components (not shown). In the alternative embodiment of FIG. 13, a chassis 202 having interactive surface 220 with aperture 233 supports an indicator panel 230 shown in the stored or retracted position relative to chassis 202 and surface 220. In the retracted position, panel 230 is substantially disposed within a volume of chassis 202 through aperture 233. A display 237 (shown in FIG. 14) is hidden within chassis 202, but a display surface 232 can be seen. Display surface 232 comprises indicator and interactive devices, including, for example, LED indicators 250, universal serial bus (USB) ports 252 to communicate with external devices, power button 254, and user identification (UID) button 256. LED indicators 250 are also known as a summary of the health of the system 200 because the LED indicators 250 generally represent the more detailed analysis of the system shown on a main display of panel 230 that is hidden in FIG. 13 and is to be more fully explained below.

Figure 14:
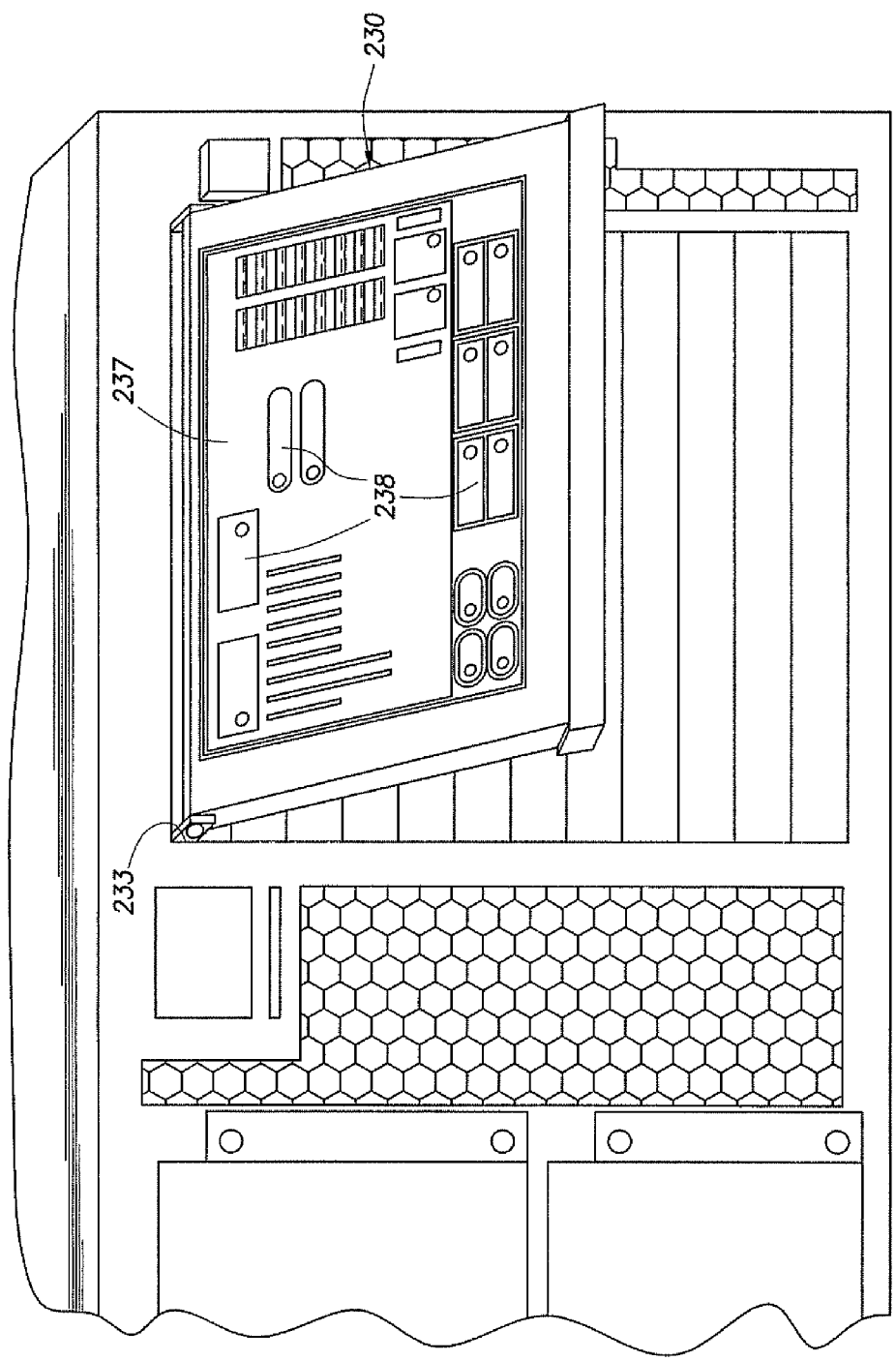
FIG. 14 shows the indicator panel of FIG. 13.
Figure 15:
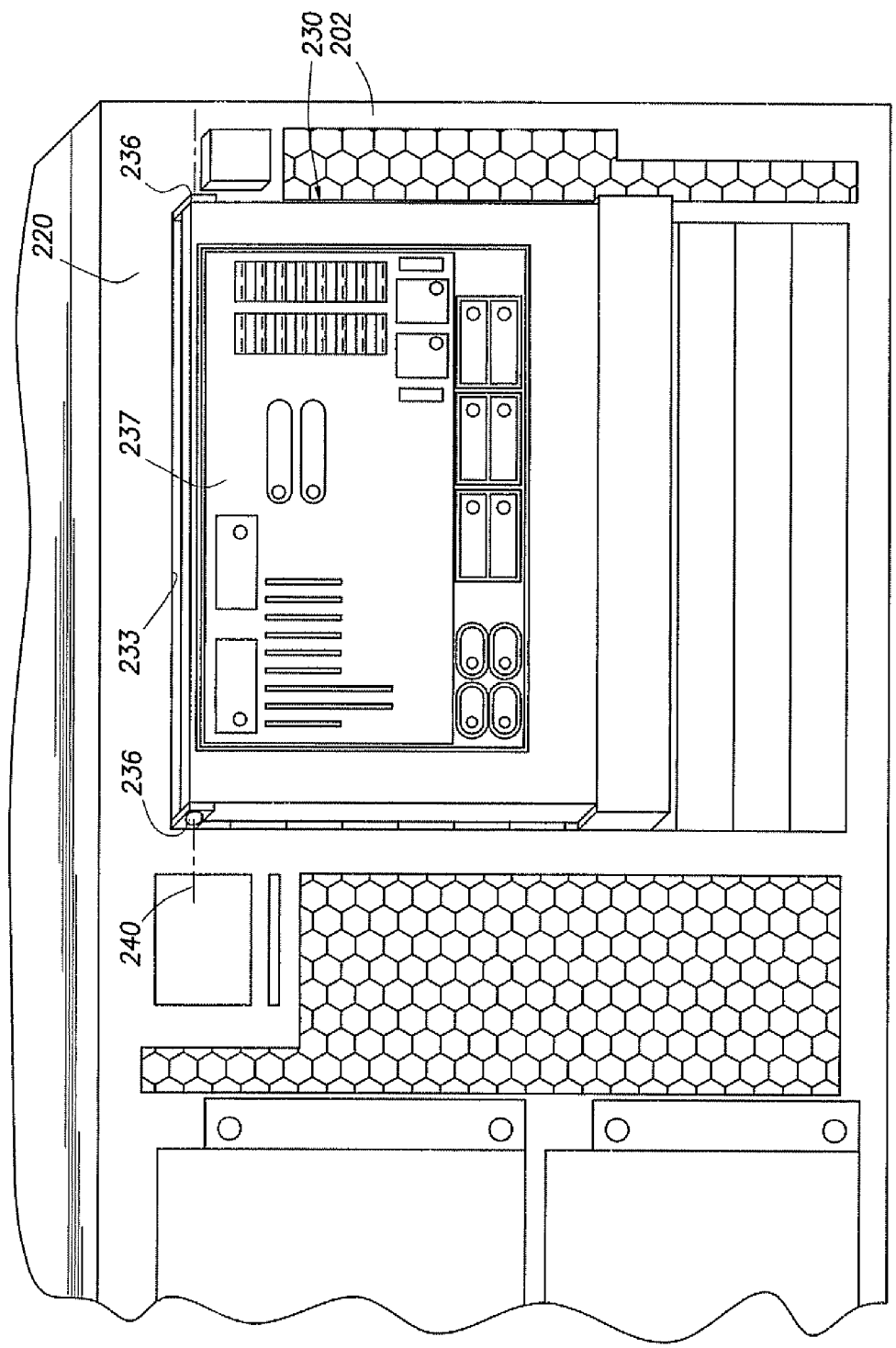
FIG. 15 shows the indicator panel of FIG. 13.

When it is necessary to know more about system 200, including, for example, when one or more indicators 250 indicate a fault in system 200, an eject button 258 is depressed. Panel 230 is then released and allowed to project away from chassis 202 and surface 220 through aperture 233 in a manner previously set forth herein In an ejected position, panel 230 appears as shown in FIG. 14 Panel 230 comprises a main display 237 having an arrangement of indicator LEDs 238 as previously set forth herein. Main display 237 contains more information and more LEDs 238 over the summary indicators 250, to make possible an exact, centralized diagnosis of a problem or fault. Further, with reference to FIG. 15, panel 230 comprises hinges 236 having an axis of rotation 240 about which panel 230 may be rotated. Hinges 236 include the various hinges set forth herein, or may include snapping hinges. Thus, panel 230 can be snapped into various angled positions relative to chassis 202 and surface 220. Based upon the warning given by indicators 250, system status indicators may be selectively analyzed and managed by ejecting panel 230 (or any of the panels set forth herein) at the user's discretion. Upon completion of the system analysis, the panel may be retracted or reinserted into the chassis for storage into a depth of the computer chassis, thereby reserving the visible and accessible front space for other purposes.

The above discussion is meant to be illustrative of the principles and various embodiments of the present invention. Numerous variations and modifications will become apparent to those skilled in the art once the above disclosure is fully appreciated. For example, an indicator panel may take various forms such as indicator panels 30, 130, 230 or any other indicator panel that may be developed by persons of ordinary skill in the art with reference to the teachings of this disclosure. It is intended that the following claims be interpreted to embrace all such variations and modifications.

What is claimed is:

1. A computer system, comprising:
   a computer chassis supporting at least one electronic component, said computer chassis having a volume and at least one interactive surface;
   an indicator panel supported by said computer chassis and coupled to said electronic component, said indicator panel having a display and an outer edge;
   wherein said indicator panel comprises a first position wherein:
      said indicator panel is received within an aperture in said interactive surface;
      said indicator panel and said display are disposed within said chassis volume; and
      said outer edge is exposed and indicates a condition of said electronic component.

2. The computer system of claim 1 wherein said outer edge further comprises an LED indicator.

3. The computer system of claim 2 wherein said LED indicator comprises a lighted strip extending along said outer edge.

4. The computer system of claim 1 wherein said outer edge further comprises:
   a second display summarizing the health of the computer system; and
   at least one port to communicate with an external device.

5. The computer system of claim 1 wherein said indicator panel further comprises a second position wherein said indicator panel and said display extend beyond said interactive surface.

6. The computer system of claim 5 wherein said display further comprises an LED indicator coupled to said at least one electronic component.

7. The computer system of claim 6 wherein said display further comprises a plurality of LED indicators coupled to a plurality electronic components, and a layout of said LED indicators corresponds with a physical layout of said electronic components.

8. A computer system, comprising:
   a computer chassis supporting at least one electronic component, said computer chassis having a volume and at least one interactive surface;
   an indicator panel supported by said computer chassis and coupled to said electronic component, said indicator panel having a display, an axis of rotation, and a warning light;
   wherein said indicator panel comprises a first position wherein said indicator panel is received within an aperture in said interactive surface and is disposed within said chassis volume;
   wherein said indicator panel comprises a second position wherein said indicator panel extends beyond said interactive surface; and
   wherein said axis of rotation is parallel to both a plane of a top surface of said chassis and a plane of said interactive surface in both of said positions.

9. The computer system of claim 8 wherein said display is in a plane of said indicator panel, and said panel plane is parallel to a plane of a top surface of said chassis in both of said positions.

10. The computer system of claim 9 wherein said indicator panel and said display are movable to a third position wherein said panel plane is transverse to said top surface plane.

11. The computer system of claim 8 wherein said display comprises an LED status indicator coupled to said electronic component and said warning light, and wherein said LED status indicator is hidden in said first position and said warning light is exposed in said first position.

12. A computer system, comprising:
   a computer chassis supporting at least one electronic component, said computer chassis having a volume and at least one interactive surface;
   an indicator panel supported by said computer chassis and coupled to said electronic component;
   wherein said indicator panel comprises a first position wherein said indicator panel is received within an aperture in said interactive surface and is disposed within said chassis volume;
   wherein said indicator panel comprises a second position wherein said indicator panel extends beyond said interactive surface; and wherein said indicator panel comprises means for indicating a status of said electronic component when said indicator panel is in said first position.

13. The computer system of claim 12 further comprising means for angling said indicator panel relative to said interactive surface in said second position.

14. The computer system of claim 12 wherein said angling means comprises causing a display of said indicator panel to face a location above and below the computer system.

15. The computer system of claim 12 wherein said indicating means further comprises:
    a display summarizing the health of the computer system; and
    at least one port to communicate with an external device.

16. The computer system of claim 12 wherein said indicator panel further comprises a display having a plurality of LED indicators coupled to a plurality electronic components, and a layout of said LED indicators corresponds with a physical layout of said electronic components.

17. An indicating device for a computer system having electronic components, comprising:
    an indicator panel having a display and an outer edge set apart from said display;
    said display having a plurality of indicators connectable to the electronic components of the computer system;
    said outer edge having an indicator connected to said plurality of display indicators; and
    wherein said outer edge indicator signals when any one of said plurality of display indicators is activated.

18. The computer system of claim 17 further comprising means for inserting said indicator panel into a computer chassis.

19. The computer system of claim 18 wherein said display is hidden in said computer chassis and said outer edge remains exposed upon insertion.

20. The computer system of claim 17 further comprising means for rotating said indicator panel about an axis.

* * * * *